(12) United States Patent
Yamada

(10) Patent No.: US 11,948,908 B2
(45) Date of Patent: Apr. 2, 2024

(54) ELECTRONIC DEVICE AND MANUFACTURING METHOD OF ELECTRONIC DEVICE

(71) Applicant: Japan Display Inc., Tokyo (JP)

(72) Inventor: Kazuyuki Yamada, Tokyo (JP)

(73) Assignee: Japan Display Inc., Tokyo (JP)

( * ) Notice: Subject to any disclaimer, the term of this patent is extended or adjusted under 35 U.S.C. 154(b) by 27 days.

(21) Appl. No.: 17/304,566

(22) Filed: Jun. 23, 2021

(65) Prior Publication Data

US 2022/0005780 A1  Jan. 6, 2022

(30) Foreign Application Priority Data

Jul. 3, 2020 (JP) ................. 2020-115596

(51) Int. Cl.
*H01L 23/00* (2006.01)
*H01L 25/16* (2023.01)

(52) U.S. Cl.
CPC .............. *H01L 24/30* (2013.01); *H01L 24/83* (2013.01); *H01L 25/167* (2013.01); *H01L 24/29* (2013.01); *H01L 24/32* (2013.01); *H01L 24/98* (2013.01); *H01L 2224/29286* (2013.01); *H01L 2224/2929* (2013.01); *H01L 2224/29291* (2013.01); *H01L 2224/29339* (2013.01); *H01L 2224/3003* (2013.01); *H01L 2224/32145* (2013.01); *H01L 2224/83052* (2013.01); *H01L 2224/83986* (2013.01); *H01L 2924/12041* (2013.01)

(58) Field of Classification Search
CPC ..... H01L 33/48; H01L 33/62; H01L 2224/83; H01L 2224/8312; H01L 2224/8319; H01L 2224/83191; H01L 2224/83192
See application file for complete search history.

(56) References Cited

U.S. PATENT DOCUMENTS

2017/0373046 A1  12/2017  Gardner et al.
2020/0373282 A1* 11/2020  Liu ........................ H01L 25/167

* cited by examiner

*Primary Examiner* — Amar Movva
*Assistant Examiner* — Stanetta D Isaac
(74) *Attorney, Agent, or Firm* — Maier & Maier, PLLC

(57) ABSTRACT

An electronic device comprising: an array substrate having a first electrode and a second electrode; a first connecting member arranged on the first electrode; a first LED chip mounted on the first connecting member; a second connecting member arranged on the second electrode and being thicker than the first connecting member; and a second LED chip mounted on the second connecting member. A distance from a reference surface of the array substrate to a top surface of the second connecting member is larger than a distance from the reference surface to a top surface of the first connecting member.

8 Claims, 15 Drawing Sheets

ELECTRONIC DEVICE AND MANUFACTURING METHOD OF ELECTRONIC DEVICE

CROSS REFERENCE TO RELATED APPLICATIONS

This application is based upon and claims the benefit of priority from the prior Japanese Patent Application No. 2020-115596 filed on Jul. 3, 2020, the entire contents of which are incorporated herein by reference.

FIELD

One embodiment of the present invention relates to an electronic device and a manufacturing method of the electronic device. In particular, one embodiment of the present invention relates to a display device as an electronic device on which electronic components including LED chips are mounted and a manufacturing method of the display device.

BACKGROUND

Display devices using a liquid crystal and an OLED (Organic Light Emitting Diode) have already been commercialized in small and medium-sized display devices such as smartphones. In particular, an OLED display device using an OLED which is a light-emitting element has the advantages of high contrast and no need for a backlight compared to a liquid crystal display device. However, since the OLED is composed of organic compounds, it is difficult to enhance reliability of the OLED display device due to the degradation of the organic compounds.

Recently, as a next generation display device, a so-called micro LED display device (or mini LED display device) in which a minute LED chip is mounted on a pixel circuit of a circuit substrate has been developed (e.g., Japanese laid-open patent publication 2018-508972). An LED is a light-emitting element similar to an OLED, but unlike the OLED, it is composed of an inorganic compound containing gallium (Ga), indium (In), and the like. Therefore, the micro LED display device is easy to enhance reliability when compared to the OLED display device. In addition, an LED chip has higher luminous efficiency and luminance than the OLED display device. Therefore, the micro LED display device is expected to be a next generation display device with high reliability, high luminance, and high contrast.

Unlike the manufacturing method of the OLED display device, the manufacturing method of the micro LED display device includes the process of mounting the LED chip. A pixel is provided with a connecting member on a pixel electrode for mounting the LED chip. The LED is electrically connected to the pixel electrode by the connecting member and fixed on the pixel electrode. In a manufacturing of the micro LED display device, a process of the mounting the LED chip is performed for each LED chip that emits light in the same color. That is, for example, firstly red LED chips are mounted in a pixel area, subsequently green LED chips are mounted in the pixel area. The distance between the red LED chip and the green LED chip in the adjacent pixels is very short. Therefore, when the green LED chip is mounted in an area next to an area in which the red LED chip is mounted, for example, after the red LED chip is mounted, a member for mounting the green LED chip may interfere with the already mounted red LED chip. In order to avoid this interference, Japanese laid-open patent publication No. 2018-508972 discloses a technique that a stepped shape of a backplane substrate (array substrate) or the thickness of a connection pad to which a conductive adhesive structure are connected are adjusted by pixels.

However, in the technique disclosed in Japanese laid-open patent publication No. 2018-508972, the stepped shape or the thickness of the connection pad can be adjusted only by a predetermined pixel. In other words, the stepped shape or the thickness of the connection pad must be adjusted during the design stage of the display device or the manufacturing stage of the array substrate. Therefore, there is a problem that the degree of freedom in the manufacturing process after forming the array substrate is small.

For example, if defects such as bright spots and dark spots are confirmed after the manufacture of the micro LED display device, these defects can be repaired by replacing the LED chip provided in the pixel where the defects were confirmed. When a new LED chip is mounted on the pixel to be repaired, it is necessary to avoid interference with the LED chips arranged in the surrounding pixels. Such a case cannot be dealt with in Japanese laid-open patent publication No. 2018-508972 since the degree of freedom in the manufacturing process after forming the array substrate is small.

SUMMARY

An electronic device according to an embodiment of the present disclosure including: an array substrate having a first electrode and a second electrode; a first connecting member arranged on the first electrode; a first LED chip mounted on the first connecting member; a second connecting member arranged on the second electrode and being thicker than the first connecting member; and a second LED chip mounted on the second connecting member. A distance from a reference surface of the array substrate to a top surface of the second connecting member is larger than a distance from the reference surface to a top surface of the first connecting member.

A manufacturing method of electronic device according to an embodiment of the present disclosure including: forming an array substrate having a first electrode and a second electrode; forming a first connecting member on the first electrode; forming a second connecting member on the second electrode so that a distance from a reference surface of the array substrate to a top surface of the second connecting member is larger than a distance from the reference surface to a top surface of the first connecting member, the second connecting member being thicker than the first connecting member; mounting a first LED chip on the first connecting member; and mounting a second LED chip on the second connecting member.

A manufacturing method of electronic device according to an embodiment of the present disclosure including: forming an array substrate having a first electrode and a second electrode; forming a first connecting member on the first electrode; forming a second connecting member on the second electrode; mounting a first LED chip on the first connecting member; mounting a second LED chip on the second connecting member; dismounting the second LED chip from the second electrode; forming a repair connecting member on the second electrode so that a distance from a reference surface of the array substrate to a top surface of the repair connecting member is larger than a distance from the reference surface to a top surface of the first connecting member, the repair connecting member being thicker than the first connecting member; forming a repair LED chip on the repair connecting member, the repair LED chip emitting light in the same emitting color as the second LED chip.

An electronic device according to an embodiment of the present disclosure including: an array substrate having a first electrode and a second electrode; a first connecting member arranged on the first electrode; a first electronic part mounted on the first connecting member; a second connecting member arranged on the second electrode and being thicker than the first connecting member; and a second electronic part mounted on the second connecting member. A distance from a reference surface of the array substrate to a top surface of the second connecting member is larger than a distance from the reference surface to a top surface of the first connecting member.

DESCRIPTION OF EMBODIMENTS

Figure 1:
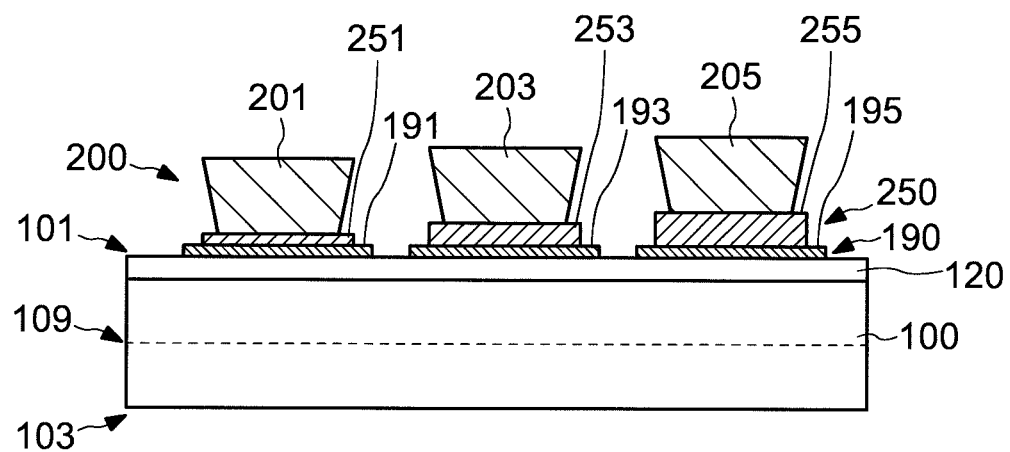
FIG. 1 is a schematic cross-sectional view of a display device according to an embodiment of the present invention.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the illustrated shapes are merely examples and does not limit the interpretation of the present invention. In this specification and the drawings, the same elements as those described above with reference to the preceding drawings are denoted by the same reference numerals, followed by an alphabet, and a detailed description thereof may be omitted as appropriate.

In the embodiments of the present invention, the direction from an array substrate toward an LED chip is referred to as above or upward. On the contrary, the direction from the LED chip toward the array substrate is referred to as below or downward. As described above, for convenience of explanation, although the phrase "upward" or "downward" is used to describe the LED chip, the LED chip may be arranged so that the vertical relationship between the array substrate and the LED chip is opposite to that shown in the drawings, for example. In the following description, the representation of an LED chip on an array substrate, for example, only describes the vertical relationship between the array substrate and the LED chip as described above, and other members may be arranged between the array substrate and the LED chip. Above or below means the stacking order in a structure in which a plurality of layers is stacked, and when expressed as a pixel electrode above a transistor, the positional relationship may be such that the transistor and the pixel electrode do not overlap in planar view. On the other hand, when expressed as a pixel electrode vertically above the transistor, it means a positional relationship such that the transistor and the pixel electrode overlap in planar view.

The expressions "a includes A, B or C", "a includes any of A, B and C", "a includes one selected from a group consisting of A, B and C", and "a includes one selected from a group consisting of A, B and C" do not exclude the case where a includes a plurality of combinations of A to C unless otherwise specified. Furthermore, these expressions do not exclude the case where a includes other elements.

The following embodiments may be combined with each other as long as there is no technical contradiction.

In the following embodiments, a display device on which LED chips are mounted is described as an example, but the present embodiment is not limited to a display device. For example, embodiments of the present invention may be applied to an electronic device provided with other electronic components such as an optical sensor in place of the LED chip or in addition to the LED chip. In the following description, a first LED chip, a second LED chip, and a third LED chip are examples of a first electronic component, a second electronic component, and a third electronic component applicable to the present embodiment. The first to third electronic components may be optical sensors for sensing different colors, sensors having different functions from each other, or sensors and electronic components other than sensors.

In view of the above problems, it is an object of embodiments of the present invention to provide an electronic device having a high degree of freedom in the design and manufacturing method.

First Embodiment

[Configuration of Display Device 10]

A display device 10 according to an embodiment of the present invention will be described with reference to FIG. 1. A pixel configuration of a part of the display device 10 is illustrated in FIG. 1. FIG. 1 is a schematic cross-sectional view of a display device according to an embodiment of the present invention. As shown in FIG. 1, the display device 10 has an array substrate 100, connecting members 250, and LED chips 200. The array substrate 100 includes a first surface 101 and a second surface 103. The first surface 101 and the second surface 103 are opposite surfaces. The array substrate 100 has a reference surface 109. In this embodiment, the reference surface 109 is a surface (top surface) of an insulating substrate included in the array substrate 100 (e.g., an insulating substrate 305B of FIG. 14). However, the reference surface 109 may be a back surface (bottom surface) of the insulating substrate. The reference surface 109 may not only be an existing flat surface such as the top surface or the bottom surface of the insulating substrate but also a flat virtual plane defined in the array substrate 100.

The array substrate 100 includes an insulating layer 120 and pixel electrodes 190 on the first surface 101 side. The pixel electrodes 190 are in contact with the insulating layer 120. Although described later, the pixel electrodes 190 are a part of wirings provided in the pixel circuits (corresponding to pixel circuits 1108 of FIG. 11). That is, although not shown in FIG. 1, the array substrate 100 includes transistors and wirings provided on the insulating substrate. The pixel electrodes 190 include a first pixel electrode 191, a second pixel electrode 193, and a third pixel electrode 195. The first pixel electrode 191, the second pixel electrode 193, and the third pixel electrode 195 are in contact with the same insulating layer 120 and have the same thickness. That is, the first pixel electrode 191, the second pixel electrode 193, and the third pixel electrode 195 are the same layer. The same layer means that a plurality of members is formed by patterning one layer. That is, the expression that the first pixel electrode 191, the second pixel electrode 193, and the third pixel electrode 195 have the same thickness means that the thickness of these pixel electrodes is within a range of film thickness variation in the substrate surface of a layer which is a base of these pixel electrodes. That is, the expression that these pixel electrodes have the same thickness does not mean that the thicknesses of these pixel electrodes are completely identical. These pixel electrodes are collectively referred to as the pixel electrodes 190 when there is no need to distinguish these pixel electrodes.

The connecting members 250 are provided on the pixel electrodes 190. The connecting members 250 connect the pixel electrodes 190 and the LED chips 200. The connecting members 250 include a first connecting member 251, a second connecting member 253, and a third connecting member 255. The first connecting member 251 is provided on the first pixel electrode 191. The second connecting member 253 is provided on the second pixel electrode 193. The third connecting member 255 is provided on the third pixel electrode 195. These connecting members are collectively referred to as the connecting members 250 when there is no need to distinguish the above three connecting members.

The second connecting member 253 is thicker than the first connecting member 251. The third connecting member 255 is thicker than each of the first connecting member 251 and the second connecting member 253. The difference between the thickness of the second connecting member 253 and the thickness of the first connecting member 251 exceeds the range of film thickness variation in the substrate surface of each connecting member. For example, when the standard deviation of the thickness of a plurality of second connecting members 253 provided on the array substrate 100 is $\sigma_2$ and the standard deviation of the thickness of a plurality of first connecting members 251 is $\sigma_1$, the range represented by $\pm 3\sigma_2$ does not overlap the range represented by $\pm 3\sigma_1$. Specifically, the second connecting member 253 is thicker than the first connecting member 251 by 300 nm or more, 500 nm or more, 1 μm or more, or 2 μm or more. Similarly, the difference between the thickness of the third connecting member 255 and the thickness of the second connecting member 253 exceeds the range of film thickness variation in the substrate surface of each connecting member. For example, when the standard deviation of the thickness of a plurality of third connecting members 255 is $\sigma_3$, the range represented by $\pm 3\sigma_3$ does not overlap the range represented by $\pm 3\sigma_2$. Specifically, the third connecting member 255 is thicker than the second connecting member 253 by 300 nm or more, 500 nm or more, 1 μm or more, or 2 μm or more.

The distance from the reference surface 109 to the top surface of the second connecting member 253 is greater than the distance from the reference surface 109 to the top surface of the first connecting member 251. In other words, in the vertical direction (or vertical direction), the position of the top surface of the second connecting member 253 is above the position of the top surface of the first connecting member 251. The distance from the reference surface 109 to the top surface of the third connecting member 255 is greater than the distance from the reference surface 109 to the top surface of the second connecting member 253. In other words, in the vertical direction, the position of the top surface of the third connecting member 255 is above the position of the top surface of the second connecting member 253.

The LED chips 200 are mounted on the connecting members 250. The LED chips 200 include a first LED chip 201, a second LED chip 203, and a third LED chip 205. The first LED chip 201 is mounted on the first connecting member 251. The second LED chip 203 is mounted on the second connecting member 253. The third LED chip 205 is mounted on the third connecting member 255. These three LED chips emit light in different colors. However, these three LED chips may emit light in the same color. These three LED chips are collectively referred to as the LED chips 200 when there is no need to distinguish the above three LED chips.

The distance from the reference surface 109 to a contact surface (or contact point) between the second connecting member 253 and the second LED chip 203 is greater than the distance from the reference surface 109 to a contact surface (or contact point) between the first connecting member 251 and the first LED chip 201. In other words, the distance from the reference surface 109 to the bottom surface of the second LED chip 203 is greater than the distance from the reference surface 109 to the bottom surface of the first LED chip 201.

In this embodiment, anode electrodes are provided at the bottoms of the LED chips 200, cathode electrodes are provided at the tops of the LED chips 200. The anode electrodes of the LED chips 200 are connected to the connecting members 250. Although not shown in FIG. 1, the cathode electrode of the LED chips 200 are connected to a conductive layer provided above the cathode electrode (e.g., a conductive layer 420B described later (see FIG. 14)). A current flowing through the LED chips 200 from the anode electrodes toward the cathode electrodes causes the LED chips 200 to emit light. In this embodiment, the LED chips 200 emit light upward. Reflective members are provided on the sidewalls of the LED chips 200. The reflective members are inclined so that the inclined surface faces upward, reflect the light emitted laterally from light-emitting parts of the LED chips 200 upward. The pixel electrodes 190 function as the reflective members and reflect the light emitted from the LED chips 200 toward the array substrate 100 upward. The LED chips 200 are not limited to the above structure and maybe a structure in which the reflective members are not formed on the sidewalls. The LED chips 200 may be flip-type LED chips provided with the anode electrodes and the cathode electrodes at the bottoms.

[Materials of Each Member of Display Device 10]

Figure 14:
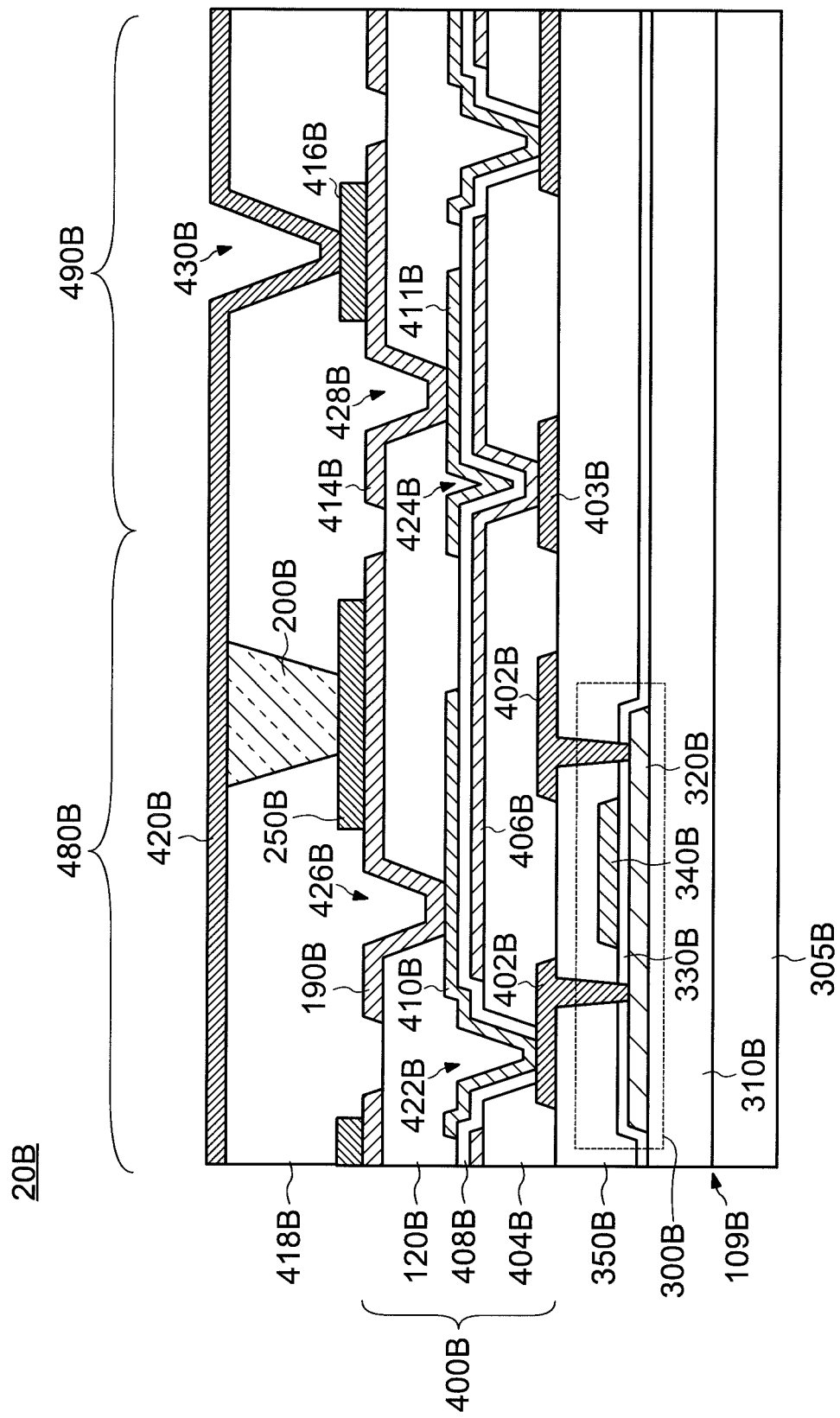
FIG. 14 is a cross-sectional view of a display device according to an embodiment of the present invention.

A substrate having light transmittance such as a glass substrate, a quartz substrate, or a plastic substrate (resin substrate) may be used as the insulating substrate of the array substrate 100 (for example, the insulating substrate 305B of FIG. 14). A substrate having a flexibility such as a polyimide substrate, an acrylic substrate, a siloxane substrate, or a fluororesin substrate may be used as the plastic substrate. When a conductive substrate is used for the array substrate 100 a metallic substrate such as a stainless substrate or an aluminum substrate may be used as the conductive substrate. An insulating layer may be formed on the surface of the conductive substrate when the conductive substrate is used for the array substrate 100. In addition to the above insulating substrates and conductive substrates, a semiconductor substrate such as a silicon substrate, a silicon carbide substrate, and a compound semiconductor substrate may be used for the array substrate 100.

The pixel electrodes 190 function as pads for forming the connecting members 250 for mounting the LED chips 200. For example, aluminum (Al), titanium (Ti), tin (Sn), chromium (Cr), cobalt (Co), nickel (Ni), molybdenum (Mo), hafnium (Hf), tantalum (Ta), tungsten (W), bismuth (Bi), silver (Ag), copper (Cu), platinum (Pt), gold (Au), and an alloy or a compound thereof are used as the pixel electrodes 190. The above materials may be used in a single layer or a stack layer as the pixel electrodes 190. Transparent conductive films may be used as the pixel electrodes 190 when the LED chips 200 emit light downward. An indium tin oxide (ITO) and an indium zinc oxide (IZO) may be used as the transparent conductive films.

The connecting members 250 function as the connecting members for mounting the LED chips 200 on the pixel electrodes 190. For example, silver pastes, solders (Sn), pastes containing metallic nanoparticles, or anisotropic conductive films (ACF) may be used as the connecting members 250. An organic substance is contained not only after applying but also in the connecting members 250 after annealing, for example, when the pastes containing metallic nanoparticles are used as the connecting members 250. On the other hand, the pixel electrodes 190 do not contain an organic substance. Even if the pixel electrodes 190 contain the organic substance as an impurity, the amount of the organic substance contained in the connecting members 250 is larger than the amount of the organic substance contained in the pixel electrodes 190. However, the amount of the organic substance contained in the pixel electrodes 190 may be the same as the amount of the organic substance contained in the connecting members 250.

An organic insulating material such as a polyimide resin, an acrylic resin, an epoxy resin, a silicone resin, a fluororesin, or a siloxane resin may be used as the insulating layer 120. Not only the organic insulating material but also an inorganic insulating material may be used as the insulating layer 120. The inorganic insulating material such as silicon oxide ($SiO_x$) silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), or aluminum nitride ($AlN_x$) may be used as the inorganic insulating material. $SiO_xN_y$ and $AlO_xN_y$ are silicon compounds and aluminum compounds containing nitrogen (N) in a smaller amount than oxygen (O). $SiN_xO_y$ and $AlN_xO_y$ are silicon compounds and aluminum compounds containing oxygen in a smaller amount than nitrogen. As the insulating layer 120, the inorganic insulating layer material and the organic insulating material may be used in a single layer or a stack layer.

[Manufacturing Method of Display Device 10]

A manufacturing method of the display device 10 will be described with reference to FIGS. 2 to 6. FIGS. 2 to 6 are cross-sectional views showing a manufacturing method of a display device according to an embodiment of the present invention.

Figure 2:
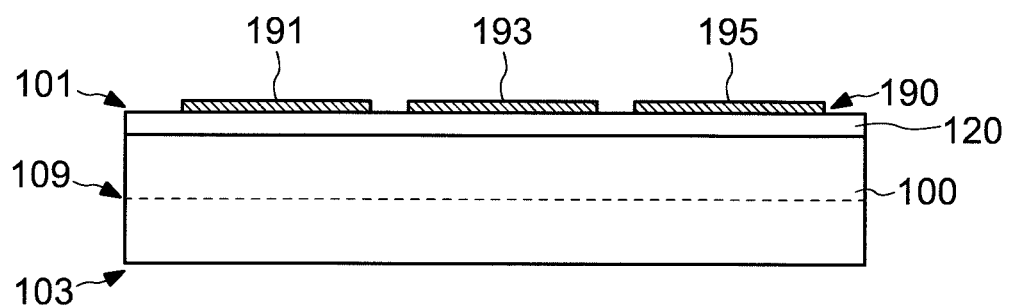
FIG. 2 is a cross-sectional view showing a manufacturing method of a display device according to an embodiment of the present invention.

As shown in FIG. 2, the first pixel electrode 191, the second pixel electrode 193, and the third pixel electrode 195 are formed in the first surface 101 sides of the array substrate 100 so as to contact the insulating layer 120. The pixel electrodes 190 are formed by forming a conductive layer which is a base of the pixel electrodes 190 on the entire surface of an effective area (an area where functional elements or wirings are formed) of the array substrate 100 and patterning the conductive layer in a photolithography process. As described above, the first pixel electrode 191, the second conductive layer 193, and the third pixel electrode 195 are formed by patterning the same conductive layer. Therefore, the film thickness of each pixel electrode is approximately the same film thickness within the range of in-plane variation of the conductive layer formed on the entire surface.

A physical vapor deposition method (PVD method) is used as a film formation method of the conductive layer which is a base of the pixel electrodes 190. However, a Chemical Vapor Deposition method (CVD method) may be used as the film formation method. A sputtering method, a vacuum evaporation method, and an electron beam evaporation method or the like are used as the PVD method. A thermal CVD method, a plasma-enhanced CVD method, a catalytic CVD method (Cat (Catalytic)-CVD method or hot wire CVD method), or the like are used as the CVD method.

Figure 3:
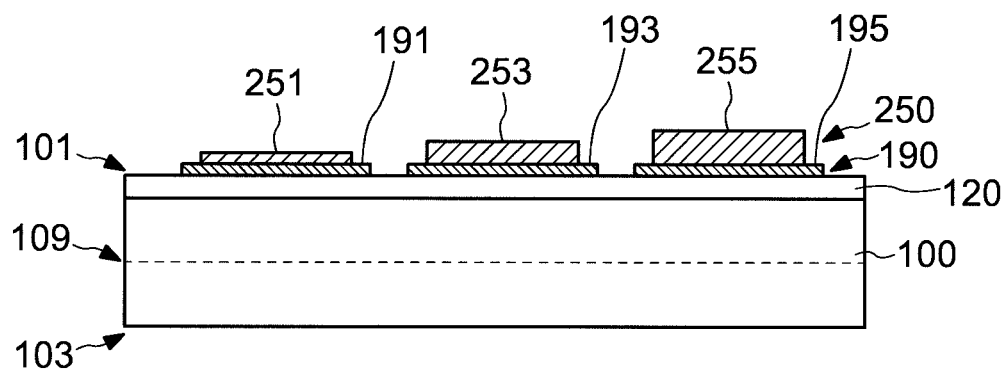
FIG. 3 is a cross-sectional view showing a manufacturing method of a display device according to an embodiment of the present invention.

As shown in FIG. 3, the first connecting member 251 is formed on the first pixel electrode 191, the second connecting member 253 is formed on the second pixel electrode 193, and the third connecting member 255 is formed on the third pixel electrode 195. The first connecting member 251, the second connecting member 253, and the third connecting member 255 are formed to have different thicknesses. Specifically, the second connecting member 253 is formed thicker than the first connecting member 251, the third connecting member 255 is formed thicker than the second connecting member 253. The first connecting member 251, the second connecting member 253, and the third connecting member 255 are formed as follows. The distance from the reference surface 109 to the top surface of the second connecting member 253 is greater than the distance from the reference surface 109 to the top surface of the first connecting member 251. The distance from the reference surface 109 to the top surface of the third connecting member 255 is greater than the distance from the reference surface 109 to the top surface of the second connecting member 253. These connecting members 250 can be formed using a micro-dispense method, an ink jet method, a pin transfer method, a mask deposition method, a mask sputtering method, an ACF (Anisotropic Conductive Film)/NCF (Non-Conductive Film) bonding method, a plating method, or a printing method.

Figure 4:
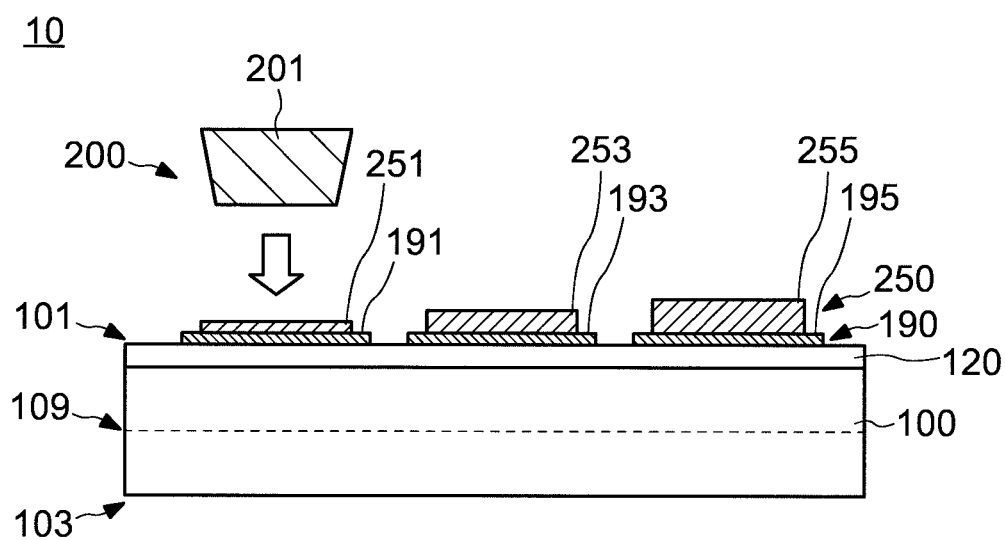
FIG. 4 is a cross-sectional view showing a manufacturing method of a display device according to an embodiment of the present invention.

As shown in FIG. 4, the first LED chip 201 is mounted on the first connecting member 251. The first LED chip 201 is mounted on each of a plurality of red pixels arranged on the entire surface of the array substrate 100, for example, when the first LED chip 201 is a red LED chip.

Figure 5:
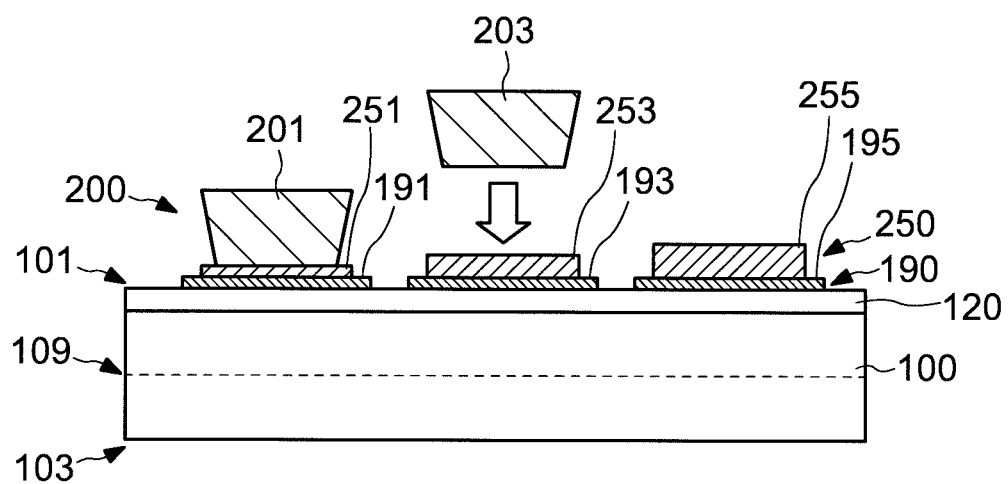
FIG. 5 is a cross-sectional view showing a manufacturing method of a display device according to an embodiment of the present invention.

Next, as shown in FIG. 5, the second LED chip 203 is mounted on the second connecting member 253. The second LED chip 203 is mounted on each of a plurality of green pixels arranged on the entire surface of the array substrate 100, for example, when the second LED chip 203 is a green LED chip. In this case, since the second connecting member 253 is thicker than the first connecting member 251, the top surface of the second LED chip 203 is positioned above the top surface of the first LED chip 201 in a state where the second LED chip 203 is in contact with the second connecting member 253. Therefore, it is possible to avoid interfering with the first LED chip 201 when the second LED chip 203 is mounted.

Figure 6:
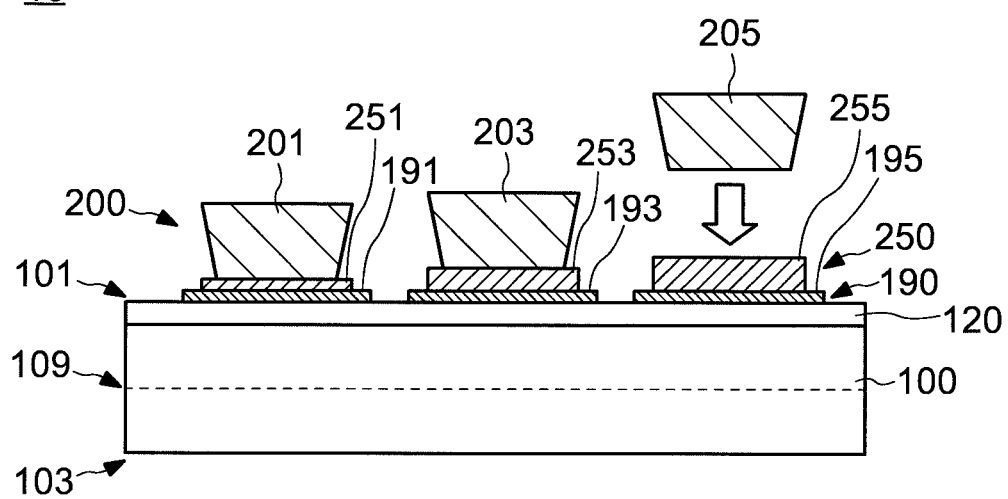
FIG. 6 is a cross-sectional view showing a manufacturing method of a display device according to an embodiment of the present invention.

Next, as shown in FIG. 6, the third LED chip 205 is mounted on the third connecting member 255. The third chip 205 is mounted on each of a plurality of blue pixels arranged on the entire surface of the array substrate 100, for example, when the third LED chip 205 is a blue LED chip. In this case, since the third connecting member 255 is thicker than each of the first connecting member 251 and the second connecting member 253, the top surface of the third LED chip 205 is positioned above the top surface of each of the first LED chip 201 and the second LED chip 203 in a state where the third LED chip 205 is in contact with the third connecting member 255. Therefore, it is possible to avoid interfering with the first LED chip 201 and the second LED chip 203 when the third LED chip 205 is mounted.

As described above, according to the display device 10 according to the present embodiment, since the thicknesses of the connecting members are different, it is possible to avoid interfering with other LED chips already mounted on its periphery when the LED chip is mounted. Since the thicknesses of the connecting members 250 can be adjusted in the process of forming the connecting members 250 after forming the array substrate 100, the degree of freedom in the design and manufacturing method in the process after forming the array substrate 100 is improved.

Second Embodiment

A display device 10A according to an embodiment of the present invention and a manufacturing method thereof will be described with reference to FIGS. 7 to 10B. In this embodiment, a method for repairing the LED chip of a defective pixel will be described in a case where a pixel defect is confirmed after manufacturing the display device 10A. FIGS. 7 to 10B are cross-sectional views showing a repair method of the display device according to an embodiment of the present invention. In the following description of the display device 10A, descriptions of features similar to those of the display device 10 of the first embodiment described with reference to FIGS. 1 to 6 are omitted, and differences from the display device 10 will be mainly described.

[Manufacturing Method of Display Device 10A]

Figure 7:
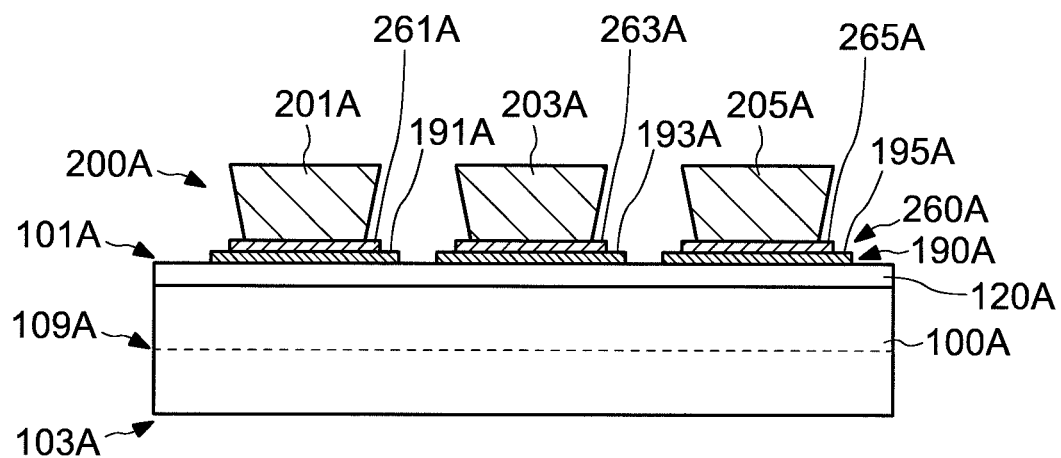
FIG. 7 is a cross-sectional view showing a repair method of a display device according to an embodiment of the present invention.

As shown in FIG. 7, a first LED chip 201A is mounted via the first connecting member 261A on a first pixel electrode 191A. A second LED chip 203A is mounted via a second connecting member 263A on a second pixel electrode 193A. A third LED chip 205A is mounted via a third connecting member 265A on a pixel electrode 195A. These connecting members are collectively referred to as connecting members 260A when there is no need to distinguish the above three connecting members. In this embodiment, the thicknesses of each of the first connecting member 261A, the second connecting member 263A, and the third connecting member 265A are the same. In this embodiment, a case where the second LED chip 203A does not emit light and needs to be repaired will be described.

Figure 8:
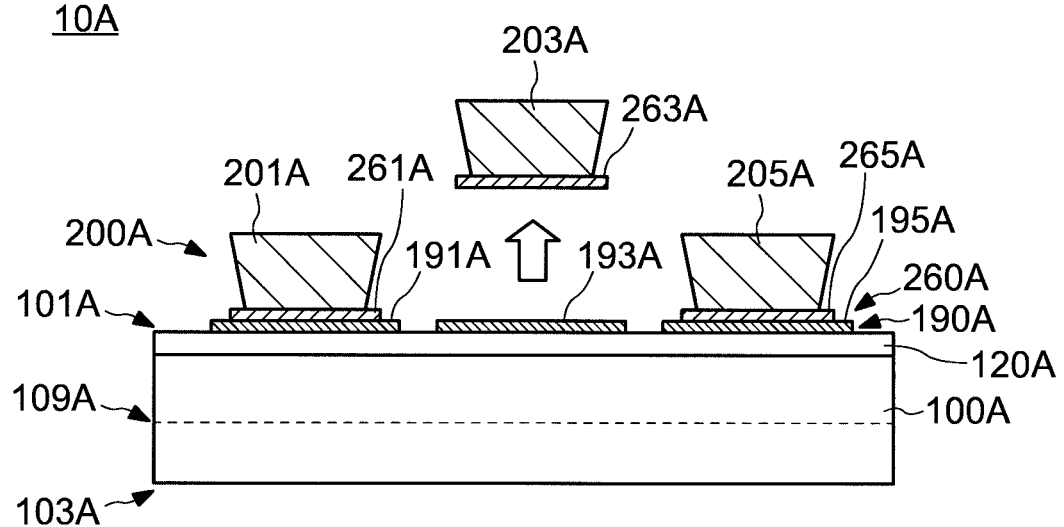
FIG. 8 is a cross-sectional view showing a repair method of a display device according to an embodiment of the present invention.

As shown in FIG. 8, the mounted second LED chip 203A is removed from the second pixel electrode 193A by pulling up the second LED chip 203A upward. In the example of FIG. 8, the second connecting member 263A is peeled off from the second pixel electrode 193A together with the second LED chip 203A. However, this is merely an example, and the second connecting member 263A may remain on the second pixel electrode 193A.

Figure 9:
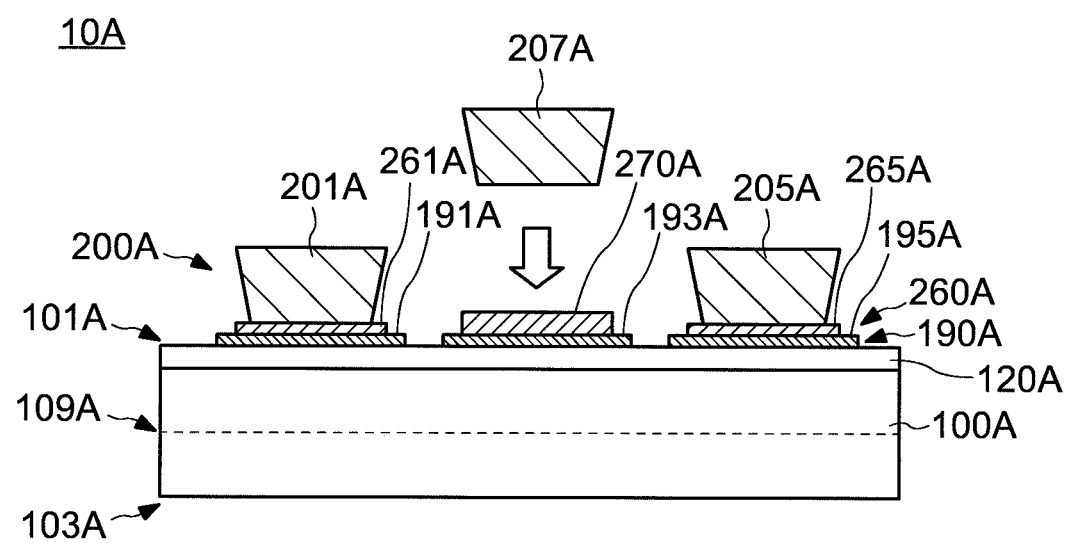
FIG. 9 is a cross-sectional view showing a repair method of a display device according to an embodiment of the present invention.

As shown in FIG. 9, a repair connecting member 270A is formed on the second pixel electrode 193A from which the second LED chip 203A has been removed. The repair connecting member 270A is thicker than each of the first connecting member 261A, the second connecting member 263A, and the third connecting member 265A. The repair connecting member 270A is formed such that the distance from a reference surface 109A to the top surface of the repair connecting member 270A is greater than the distance from the reference surface 109A to the top surface of the first connecting member 261A (or the third connecting member 265A). A repair LED chip 207A is then mounted on the repair connecting member 270A. The repair LED chip 207A is an LED chip that emits light in a color that would have been obtained if the second LED chip 203A had originally emitted light normally.

Figure 10A:
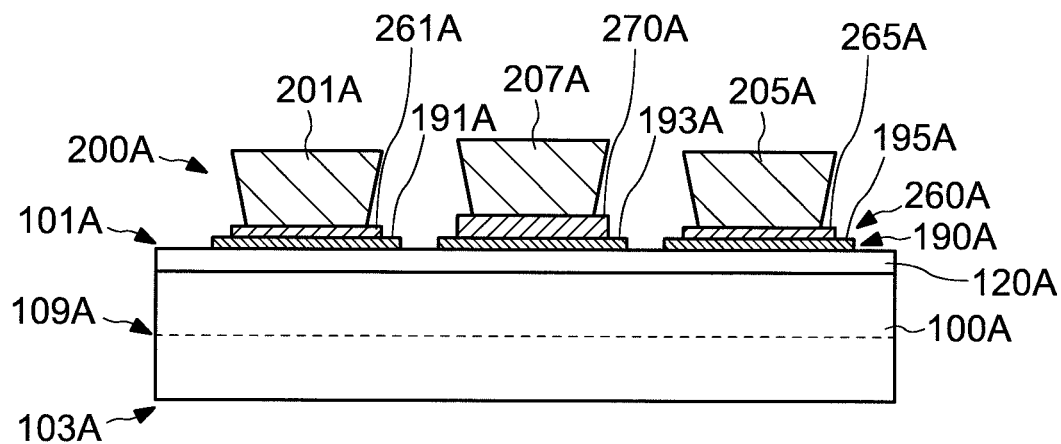
FIG. 10A is a cross-sectional view showing a repair method of a display device according to an embodiment of the present invention.

By performing the repair operation as described above, the second LED chip 203A in which a light emission failure has occurred is replaced with the repair LED chip 207A, and the display device 10A shown in FIG. 10A is completed.

As described above, according to the display device 10A of the present embodiment, since the repair connecting member 270A is thicker than the surrounding connecting members, it is possible to avoid interfering with other LED chips already mounted on its periphery when mounting the repair LED chip 207A.

In this embodiment, a configuration in which the thicknesses of a plurality of connecting members 260A before repairing are the same had exemplified, but the present invention is not limited to this configuration. For example, the thicknesses of the plurality of connecting members before repairing may be different as in the first embodiment. In this case, the thickness of the repair LED chip 207A is preferably greater than the difference between the thickest connecting member and the thinnest connecting member. Instead of forming the repair connecting member 270A on the second pixel electrode 193A, the repair LED chip 207A may be formed on the second pixel electrode 193A in a state where a member corresponding to the repair connecting member 270A is formed on the bottom surface of the repair LED chip 207A.

Hereinafter, similar to the first embodiment shown in FIG. 1, a case when the above repair is performed with respect to the display device 10 provided with the first LED chip 201, which is a red LED chip, the second LED chip 203, which is a green LED chip, and the third LED chip 205, which is a blue LED chip will be described. In this case, the thicknesses of the connecting members 251, 253, and 255 are different for each emission color of the respective LEDs. When repairing such the display device 10, the thickness of the repair connecting member 270A is greater than the thickest connecting member (the connecting member 255 in the example of FIG. 10B) among the connecting members 251, 253, and 255. An example in which a repair of the first LED chip 201 had performed at a pixel and the repair LED chip 207A had arranged via the repair connecting member 270A instead of the first LED chip had shown 201 FIG. 10B. The repair LED chip 207A in FIG. 10B may be referred to as a fourth LED chip (or fourth electronic component). The repair connecting member 270A may be referred to as a fourth connecting member.

Figure 10B:
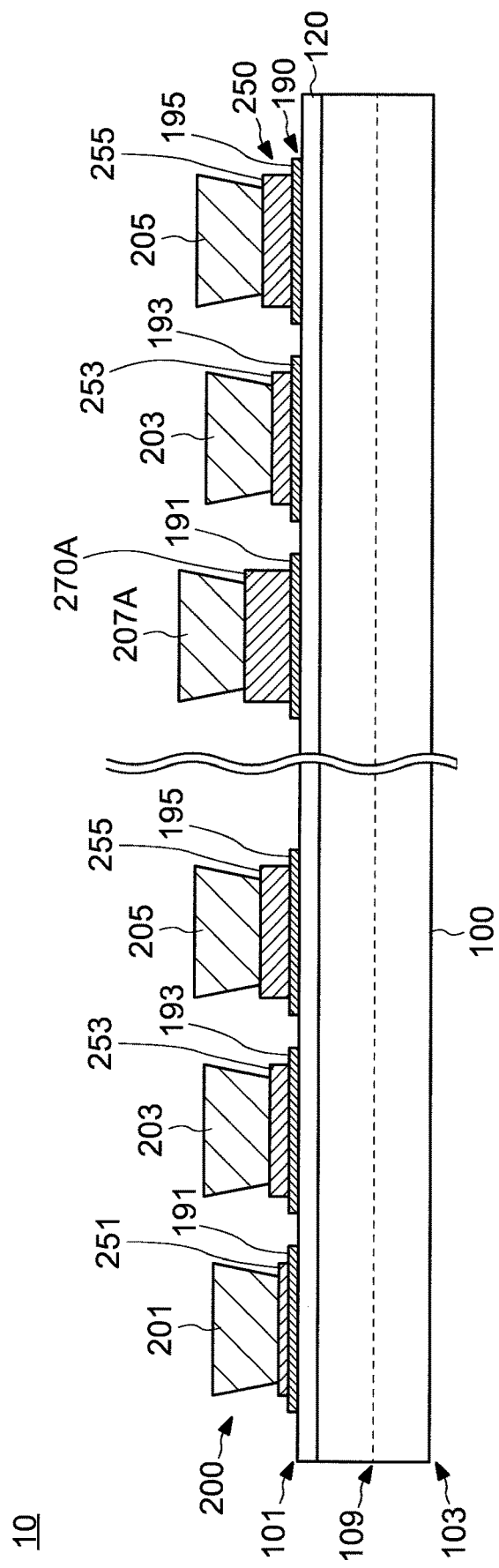
FIG. 10B is a schematic cross-sectional view of a repaired display device according to an embodiment of the present invention.

The repair LED chip 207A in FIG. 10B is red. As described above, when repairs are made to the display device 10 provided with the three connecting members 251, 253, and 255 having different thicknesses, as shown in FIG. 10B, it is configured to have the four connecting members (the connecting members 251, 253, 255, and the repair connecting member 270A) having different thicknesses. If repairs are made for each LED color, three repair connecting members (a red repair connecting member, a green repair connecting member, and a blue repair connecting member) having different thicknesses may be provided. In this case, the display device 10 is provided with six connecting members (the connecting members 251, 253, 255, the red repair connecting member, the green repair connecting member, and the blue repair connecting member) having different thicknesses. In other words, a configuration in which the connecting members having different heights has been provided in the same color LED is obtained.

Third Embodiment

The entire configuration of a display device according to an embodiment of the present invention will be described with reference to FIGS. 11 to 14. A display device 20B shown in the following embodiment can be manufactured by applying the manufacturing method of the display device 10 in the first embodiment and the repair method of the display device 10A in the second embodiment.

[Outline of Display Device 20B]

Figure 11:
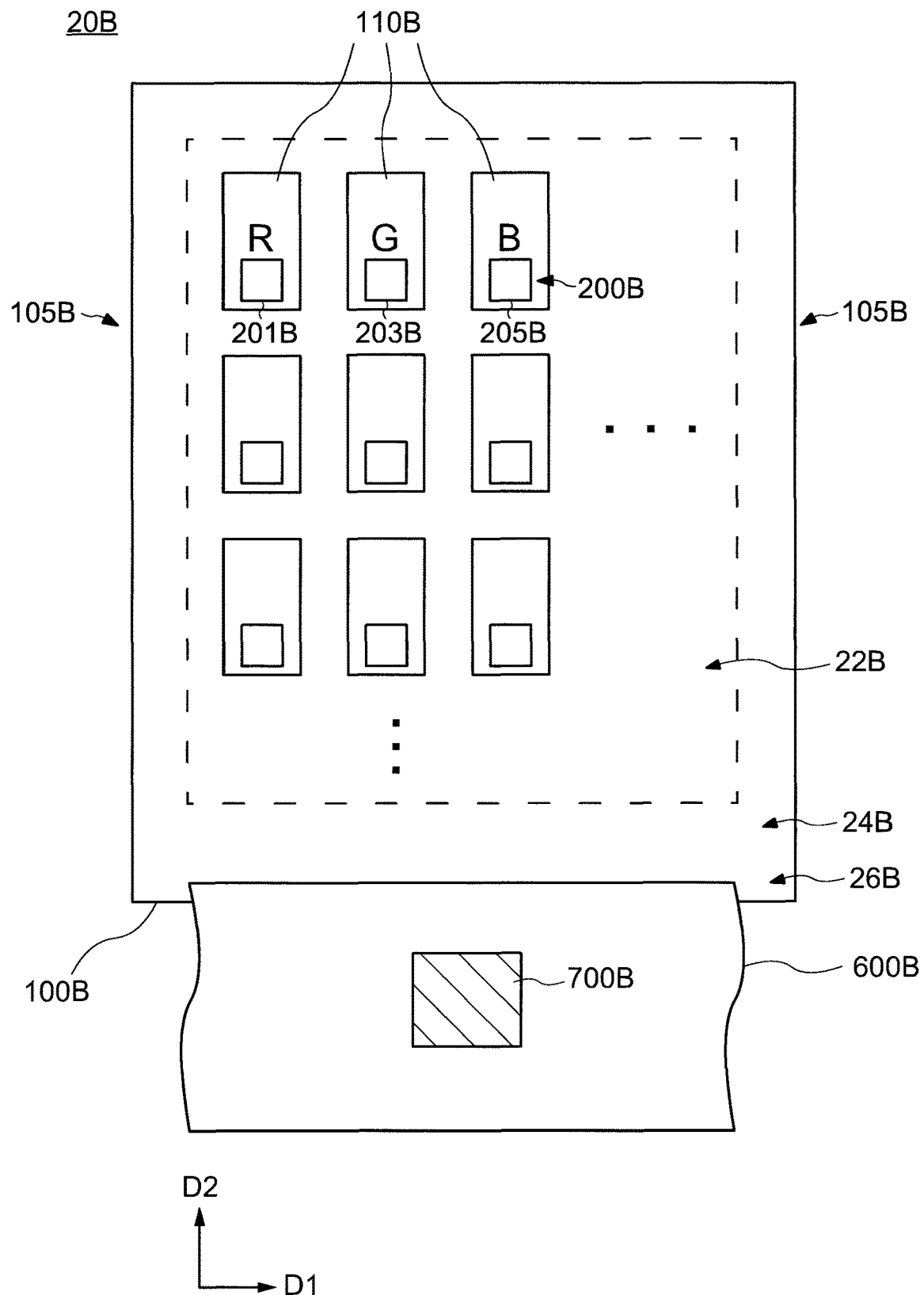
FIG. 11 is a plan view showing an entire configuration of a display device according to an embodiment of the present invention.

FIG. 11 is a plan view showing the entire configuration of a display device according to an embodiment of the present invention. As shown in FIG. 11, the display device 20B includes an array substrate 100B, a flexible printed circuit substrate 600B (FPC 600B), and an IC chip 700B. The display device 20B is divided into a display area 22B, a peripheral area 24B, and a terminal area 26B. The display area 22B is an area that the pixel circuits 110B including LED chips 200B are arranged in a matrix and displaying images. The peripheral area 24B is an area around the display area 22B and is an area provided with a driver circuit that controls the pixel circuits 110B. The terminal area 26B is an area provided with the FPC 600B. The side surfaces of the array substrate 100B of the outer edges of the peripheral area 24B and the terminal area 26B are third surfaces 105B. The IC chip 700B is provided on the FPC 600B. The IC chip 700B supplies a signal for driving each of the pixel circuits 110B. The present invention is not limited to the above examples, and for example, the IC chip 700B may be a COG (Chip on glass) structure mounted on the array substrate 100B.

[Circuit Configuration of Display Device 20B]

Figure 12:
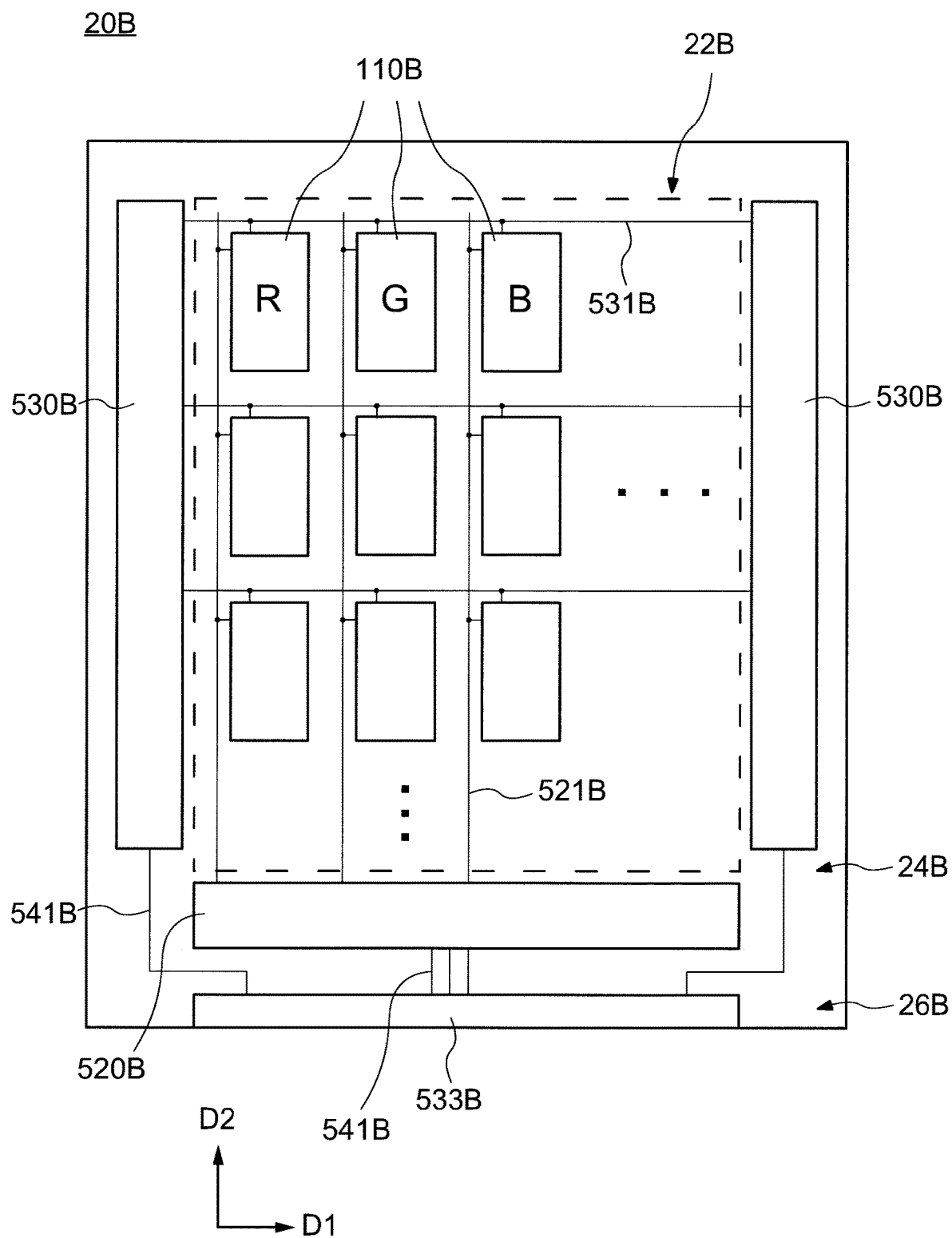
FIG. 12 is a block diagram showing a circuit configuration of a display device according to an embodiment of the present invention.

FIG. 12 is a block diagram showing a circuit configuration of a display device according to an embodiment of the present invention. As shown in FIG. 12, a source driver circuit 520B is provided in the second direction D2 (column direction) at a position adjacent to the display area 22B where the pixel circuits 110B are arranged. Gate driver circuits 530B are provided in the first direction D1 (row direction) at positions adjacent to the display area 22B. The source driver circuit 520B and the gate driver circuits 530B are provided in the above peripheral area 24B. However, the areas in which the source driver circuit 520B and the gate driver circuits 530B are provided are not limited to the peripheral area 24B and maybe any area as long as it is outside the area provided with the pixel circuits 110B.

Source wirings 521B extend from the source driver circuit 520B in the second direction D2, and are connected to a plurality of pixel circuits 110B arranged in the second direction D2. Gate wirings 531B extend from the gate driver circuits 530B in the first direction D1, and are connected to the plurality of pixel circuits 110B arranged in the first direction D1.

A terminal part 533B is provided in the terminal area 26B. The terminal part 533B and the source driver circuit 520B are connected by connecting wirings 541B. Similarly, the terminal part 533B and the gate driver circuits 530B are connected by the connecting wirings 541B. An external device to which the FPC 600B is connected is connected to the display device 20B when the FPC 600B is connected to the terminal part 533B. Consequently, the respective pixel circuits 110B provided in the display device 20B are driven by a signal from the external device.

The display devices 10 and 10A shown in the first embodiment and the second embodiment correspond to a part of the pixel circuits 110B of the display device 20B shown in the third embodiment.

[Pixel Circuits 110B of Display Device 20B]

Figure 13:
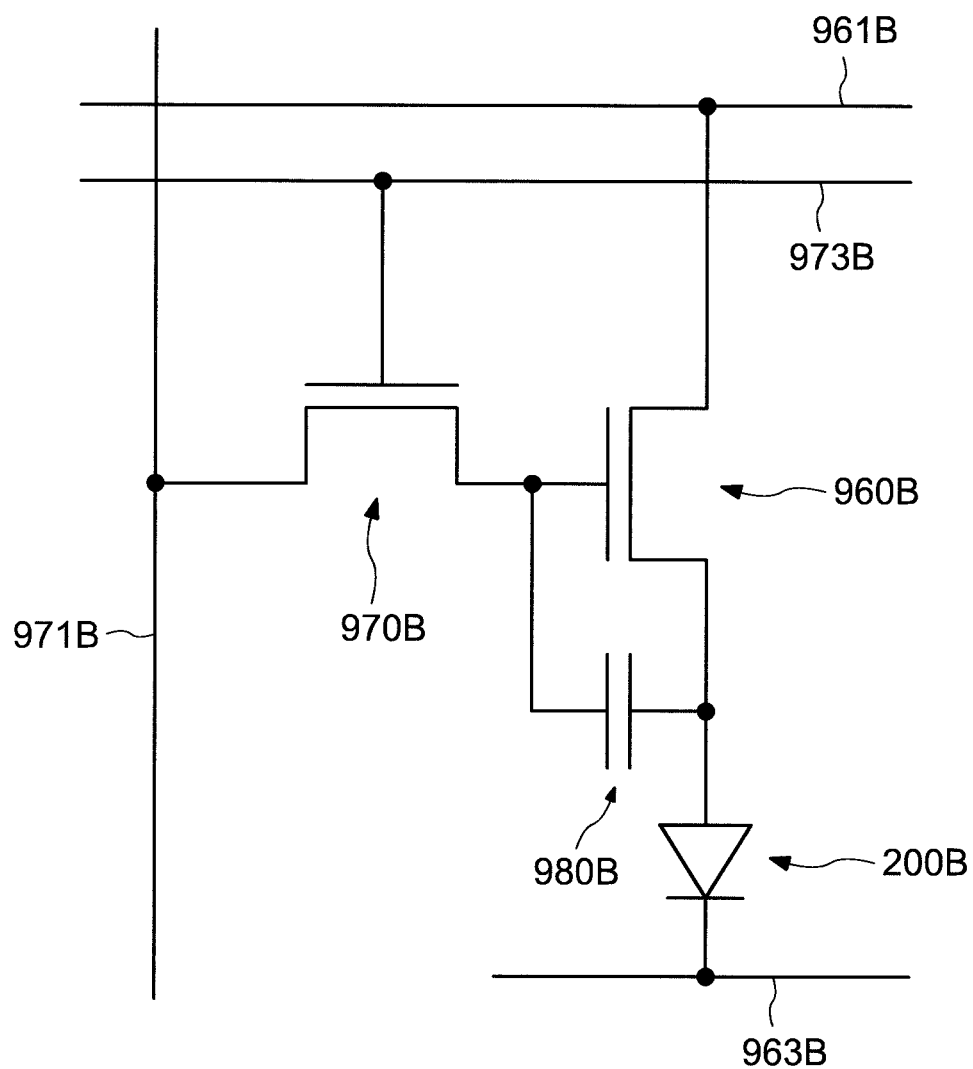
FIG. 13 is a circuit diagram showing a pixel circuit of a display device according to an embodiment of the present invention.

FIG. 13 is a circuit diagram showing a pixel circuit of a display device according to an embodiment of the present invention. As shown in FIG. 13, the pixel circuits 110B include a drive transistor 960B, a select transistor 970B, a storage capacitor 980B, and an element such as the LED chip 200B. A source electrode of the select transistor 970B is connected to a signal line 971B. The gate electrode of the select transistor 970B is connected to a gate line 973B. A source electrode of the drive transistor 960B is connected to an anode power line 961B. A drain electrode of the drive transistor 960B is connected to an anode of the LED chip 200B. A cathode of the LED chip 200B is connected to a cathode power line 963B. A gate electrode of the drive transistor 960B is connected to a drain electrode of the select transistor 970B. The storage capacitor 980B is connected to the gate electrode and drain electrode of the drive transistor 960B. The signal line 971B is supplied with a gradation signal that determines the emission intensity of the LED chip 200B. The gate line 973B is supplied with a signal that selects a pixel row to write the above gradation signal.

[Cross-Sectional Structure of Display Device 20B]

FIG. 14 is an cross-sectional view of the pixel circuit 110B of the display device 20B according to an embodiment of the present invention. As shown in FIG. 14, the display device 20B includes a transistor 300B and a wiring part 400B. The pixel circuit 110B is constituted by the transistor 300B and the wiring part 400B.

The transistor 300B is provided on the insulating substrate 305B and a base layer 310B. In this embodiment, a reference surface 109B is the top surface of the insulating substrate 305B. The transistor 300B includes a semiconductor layer 320B, a gate insulating layer 330B, a gate electrode 340B, an insulating layer 350B, and conductive layers 402B (source electrode and drain electrode). The semiconductor layer 320B is provided on the base layer 310B. The gate electrode 340B is provided above the semiconductor layer 320B. The gate insulating layer 330B is provided between the semiconductor layer 320B and the gate electrode 340B. The insulating layer 350B is provided above the gate insulating layer 330B and the gate electrode 340B. The conductive layers 402B are provided above the insulating layer 350B and are connected to the semiconductor layer 320B via openings provided in the insulating layer 350B.

The wiring part 400B includes the conductive layers 402B, a conductive layer 403B, a planarization layer 404B, a conductive layer 406B, an insulating layer 408B, a conductive layer 410B, a conductive layer 411B, an insulating layer 120B, a conductive layer 414B, a conductive layer 416B, pixel electrodes 190B, and a connecting member 250B. In the following description, an area provided with a wiring (the connecting member 250B) connected to the anode of the LED chip 200B is referred to as a first area 480B. An area provided with a wiring (the conductive layer 416B) connected to the cathode of the LED chip 200B is referred to as a second area 490B.

The planarization layer 404B is provided on the conductive layers 402B. The planarization layer 404B is provided with an opening 422B for exposing a part of the conductive layers 402B in the first area 480B, and an opening 424B for exposing a part of the conductive layer 403B in the second area 490B. The conductive layer 406B is provided on the planarization layer 404B and is connected to the conductive layer 403B via the opening 424B. The insulating layer 408B is provided on the conductive layer 406B. The insulating layer 408B is provided with an opening at a position corresponding to the opening 422B. The conductive layer 406B is supplied with, for example, a common power supply voltage PVDD.

The conductive layer 410B and the conductive layer 411B are provided on the insulating layer 408B. The conductive layer 410B is connected to the conductive layers 402B via the opening 422B. The conductive layer 411B is insulated from the conductive layer 406B by the insulating layer 408B. The conductive layer 411B is supplied with, for example, a common power supply voltage PVSS (e.g., a ground voltage GND).

The insulating layer 120B is provided on each of the conductive layer 410B and the conductive layer 411B. The insulating layer 120B is provided with an opening 426B that exposes the conductive layer 410B and an opening 428B that exposes the conductive layer 411B. The pixel electrodes 190B and the conductive layer 414B are provided in contact with the insulating layer 120B. A planarization layer is used as the insulating layer 120B. The pixel electrodes 190B are connected to the conductive layer 410B via the opening 426B. The conductive layer 414B is connected to the conductive layer 411B via the opening 428B.

The connecting member 250B is provided on the pixel electrodes 190B. The conductive layer 416B is provided on the conductive layer 414B. The connecting member 250B is used to mount the LED chip 200B on the wiring part 400B. That is, the connecting member 250B has the function of bonding the LED chip 200B and the pixel electrodes 190B and electrically connecting them. Similar to the connecting member 250B, the conductive layer 416B is formed using a micro-dispense method, an ink jet method, a pin transfer method, a mask deposition method, a mask sputtering method, an ACF (Anisotropic Conductive Film)/NCF (Non-Conductive Film) bonding method, or a printing method.

A planarization layer 418B is provided to embed the LED chip 200B on each of the connecting member 250B and the conductive layer 416B. The planarization layer 418B is provided with an opening 430B that exposes the conductive layer 416B. The top surface of the planarization layer 418B coincides with the top surface of the LED chip 200B. It is sufficient that the top surface of the LED chip 200B is exposed from the planarization layer 418B, the top surface of the planarization layer 418B may not be coincident with the top surface of the LED chip 200B. The conductive layer 420B is provided on the planarization layer 418B. The conductive layer 420B is connected to the LED chip 200B. The conductive layer 420B is connected to the conductive layer 416B via the opening 430B.

The connecting member 250B is connected to the anode of the LED chip 200B. The conductive layer 420B is connected to the cathode of the LED chip 200B. When an ON-voltage for turning on the transistor 300B is supplied to the gate electrode 340B, the voltage supplied to a signal line (not shown) is supplied to the anode of the LED chip 200B via the transistor 300B, the conductive layer 410B, the pixel electrodes 190B, and the connecting member 250B. The cathode of the LED chip 200B is connected to the conductive layer 411B via the conductive layers 420B, 416B, 414B.

[Materials of Each Member of Display Device 20B]

Al, Ti, Cr, Co, Ni, Mo, Hf, Ta, W, Bi, Ag, Cu, and an alloy or a compound thereof are used as the respective conductive layers constituting the transistor 300B and the wiring part 400B, and the gate electrode 340B. The above materials may be used as these conductive layers and the gate electrode in a single layer or a stack layer. For example, a transparent conductive material such as indium tin oxide (ITO) or indium zinc oxide (IZO) may be used as the respective conductive layers constituting the wiring part 400B. In particular, a transparent conductive material is used as the conductive layer 420B. The pixel electrodes 190B have a function of reflecting a light emitted from the LED chip 200B toward the wiring unit 400B upward. Therefore, a material with higher reflectivity than other conductive layers is used as the pixel electrodes 190B.

Inorganic insulating materials such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), or aluminum nitride ($AlN_x$) are used as the respective insulating layers constituting the transistor 300B and the wiring part 400B, the gate insulating layer 330B, and the base layer 310B. Not only an inorganic insulating material but also an organic insulating material may be used as these insulating layers. For example, a polyimide resin, an acrylic resin, an epoxy resin, a silicone resin, a fluororesin, or a siloxane resin is used as the organic insulating material. As the above insulating layers, the inorganic insulating layer material and the organic insulating material may be used in a single layer or a stack layer.

Each planarization layer constituting the wiring part 400B can alleviate the steps of unevenness formed by the structure located below each of them. For example, an organic resin such as a polyimide resin, an acrylic resin, an epoxy resin, a silicone resin, a fluororesin, or a siloxane resin is used as a material of the planarizing layer. As the above planarizing layer, the above organic resin may be used in a single layer or a stack layer.

Each of the embodiments described above as the embodiment of the present invention can be appropriately combined and implemented as long as they do not contradict each other. It is also within the scope of the present invention that a skilled in the art adds, deletes, or changes designs of constituent elements, or adds, omits, or changes conditions of processes as appropriate based on the display device of the respective embodiments as long as the gist of the present invention is provided. The above embodiment has been described with reference to an LED chip as an example of an electronic component, but the electronic component is not limited to the LED chip. The LED chips may be replaced with other electronic components such as optical sensors. That is, the present invention is not limited to a display device, and the present invention can be applied to an electronic device in which other electronic components are mounted instead of or in addition to an LED. Furthermore, the above repair LED chip 207A can be replaced with an electronic component such as an optical sensor, for example, and the present invention can be applied to an electronic device in which other electronic components are combined with a display device using an LED. That is, in this case, electronic components such as an optical sensor can be referred to as the fourth electronic component.

Even if it is other working effects which is different from the working effect brought about by the mode of each of the above embodiments, what is clear from the description in this description, or what can be easily predicted by the person skilled in the art is naturally understood to be brought about by the present invention.

What is claimed is:

1. An electronic device comprising:
    an array substrate having a first electrode and a second electrode;
    a first connecting member arranged on the first electrode;
    a first LED chip mounted on the first connecting member;
    a second connecting member arranged on the second electrode and being thicker than the first connecting member; and
    a second LED chip mounted on the second connecting member,
    wherein a distance from a reference surface of the array substrate to a top surface of the second connecting member is larger than a distance from the reference surface to a top surface of the first connecting member, and the first connecting member and the second connecting member include an organic substance.

2. The electronic device according to claim 1, wherein the first LED chip emits light in different emitting color from the second LED chip.

3. The electronic device according to claim 2, further comprising:
    a third connecting member thicker than each of the first connecting member and the second connecting member; and
    a third LED chip mounted on the third connecting member, the third LED chip emitting light in different emitting color from each of the first LED chip and the second LED chip,
    wherein
    the array substrate further has a third electrode, and
    the third connecting member is provided on the third electrode.

4. The electronic device according to claim 3, wherein the third connecting member is thicker than the second connecting member 1 micro meter or more.

5. The electronic device according to claim 3, wherein
    the array substrate further has an insulating layer, and
    each of the first electrode, the second electrode and the third electrode is in contact with the insulating layer.

6. The electronic device according to claim 1, wherein the second connecting member is thicker than the first connecting member 1 micro meter or more.

7. The electronic device according to claim 1, wherein an amount of organic substance included in the first connecting member and the second connecting member is larger than an amount of organic substance included in the first electrode and the second electrode.

8. The electronic device according to claim 1, wherein
    the array substrate further has an insulating layer, and
    each of the first electrode and the second electrode is in contact with the insulating layer.

* * * * *